United States Patent [19]

Fukatsu et al.

[11] Patent Number: 4,689,438

[45] Date of Patent: Aug. 25, 1987

[54] PHOTOVOLTAIC DEVICE

[75] Inventors: Takeo Fukatsu; Masaru Takeuchi, both of Uji; Kazuyuki Gotoh, Hirakata, all of Japan

[73] Assignee: Sanyo Electric Co., Ltd., Osaka, Japan

[21] Appl. No.: 787,987

[22] Filed: Oct. 16, 1985

[30] Foreign Application Priority Data

Oct. 17, 1984 [JP] Japan .................................. 59-217854
Nov. 22, 1984 [JP] Japan .................................. 59-247189

[51] Int. Cl.⁴ ............................................. H01L 31/06
[52] U.S. Cl. ..................................... 136/256; 136/258; 357/30; 357/59
[58] Field of Search ................. 136/256, 258 AM; 357/30, 59 C

[56] References Cited

U.S. PATENT DOCUMENTS 4,568,791 2/1986 Kawai ................................. 136/256

FOREIGN PATENT DOCUMENTS 59-17287 1/1984 Japan ........................... 136/258 AM
59-119874 7/1984 Japan ........................... 136/258 AM Primary Examiner—Aaron Weisstuch
Attorney, Agent, or Firm—Handal & Morofsky

[57] ABSTRACT

The photovoltaic device of this invention has a p-type layer of oxides of the platinum group between a transparent electrode layer texturized at the side opposite the light incident surface and a semiconductive layer having a semiconductor junction and including a p-type layer at the light incident side thereof.

With such a construction, the optical path length of an incident ray is increased, thereby improving the photoelectric conversion efficiency. Also, since the p-type semiconductive layer contacts the p-type layer of oxides of the platinum group, imperfections in the semiconductor junction can be reduced. Accordingly, with a photovoltaic device of this invention, the peak value of the photoelectric conversion efficiency can be increased and also the manufacturing yield can be remarkably increased.

18 Claims, 3 Drawing Figures

PHOTOVOLTAIC DEVICE

TECHNICAL FIELD

The present invention relates to photovoltaic devices, generally referred to as solar cells and using photoelectric conversion by means of a semiconductor junction.

BACKGROUND ART

Photovoltaic devices using the photovoltaic effect in a semiconductor junction in a layer of an amorphous silicon derivative are known. The basic construction of such a photovoltaic device consists of a transparent electrode layer, a semiconductive layer (photoactive layer) and a back electrode layer deposited in this order on a transparent substrate such as glass.

On the other hand, as discussed in Japanese Laid-Open Patent Application No. 58-57756, a preprint of the Autumn Meeting of the Japanese Society of Applied Physics (1983) 25P-L-2, p. 351 and other Publications, the light incident surface of a transparent electrode layer has been texturized to a roughness of 0.1 um to 2.5 um to increase the optical path length of incident rays in order to improve the photoelectric conversion characteristics of a photovoltaic device.

It has been well known that optically generated charge carriers such as electrons and holes contributing to the generation of electricity are mainly generated in the non-doped or intrinsic region of the photoactive layer by the irradiation of light. Accordingly, in order to improve photoelectric conversion efficiency, it is necessary only to suppress the absorption of light by an impurity doped layer positioned closer to the light incident side than the intrinsic layer. To this end, the thickness of the impurity doped layer has been reduced to a few hundred angstroms. Also, as disclosed in Japanese Laid-Open Patent Application No. 57-95677, it has been proposed that the above described impurity doped layer on the light incident side be formed of, for example, amorphous silicon carbide having high light-transmissivity in order to obtain a window effect.

However, where the surface of the transparent electrode layer is texturized as described above, it is difficult to form the impurity doped layer on the transparent substrate side of the semiconductive layer uniformly in thickness, whereby a problem has occurred in that the semiconductor junction in the semiconductive layer tends to be imperfect.

On the other hand, as has been shown experimentally, metals of the platinum group such as Ir (metal elements Ru, Rh, Pd, Os, Ir and Pt belonging to Group VIII of the Periodic Table) may be used in the form of an oxide film to make a transparent electrode layer for the above described photovoltaic device. A sputtering method, an anodic oxidation method, a chemical transport reaction method and the like have been used for forming such an oxide film.

In the sputtering method, a material to be deposited is sputtered by heating or ion impact in a low-pressure atmosphere so as to deposit on a substrate, as disclosed in, for example, *Physical Review B*, Vol. 26, No. 2, p. 471. In the anodic oxidation method a metallic film is formed on a substrate by a suitable method and then is oxidized by an oxidation reaction when the substrate is used as an anode during electrolysis, as disclosed in, for example, "Technical Report of the Electronics and Communication Engineers of Japan, ED83-10, p. 1". In the chemical transport reaction method, for example, an Ir-oxide film is formed on a substrate by spraying $O_2$ gas on metallic Ir in an atmosphere of about 1,400° C. to form gaseous $IrO_3$ having a high temperature and transferring the resulting gas to an atmosphere of about 1000° C., where the gas is cooled to be transformed into solid $IrO_2$ which deposits on the substrate, as disclosed in, for example, "*Physical Review B*, Vol. 24, No. 12, p. 7342.

However, each of the above described conventional methods has various kinds of problems. The sputtering method has problems in that the film-forming speed is small (1 Å/min or less). It is difficult to control the oxygen content in the film, since it is necessary to use a large-size target. The object on which the film is formed is also large-sized, thereby increasing manufacturing cost. The anodic oxidation method has problems in that it is difficult to increase the film thickness, it is difficult to oxidize the depth of the metallic film, and the like. The chemical transport reaction method has problems in that since it is necessary to carry it out in an atmosphere having high temperatures (800° C. or more), the apparatus must be formed of heat-resistant materials, manufacturing facilities are expensive, and the like.

SUMMARY OF THE INVENTION

The present invention has the object of solving the above described problems. The inventive photovoltaic device is capable of eliminating the problem that the semicondutor junction in a semiconductive layer is incompletely formed when the surface of a transparent electrode layer disposed between a transparent substrate and the semiconductive layer is texturized in order to increase the optical path length of incident rays. At the same time, a photovoltaic device having an improved photoelectric conversion efficiency is provided by eliminating the problem of incomplete junction formation. The inventive photovoltaic device is also capable of being made with increased manufacturing yield.

The device is inexpensive and of high quality because it employs a transparent electrode layer manufactured by a method in which the film-forming speed is high, the oxygen-content in the film can be easily controlled, and a thick film can be easily formed, without requiring any heat-resistant facilities.

BRIEF DESCRIPTION OF THE DRAWINGS

These and other objects and advantages of the invention will become apparent from the following description taken with reference to the drawings which illustrate only one embodiment of the invention, in which.

DETAILED DESCRIPTION OF THE INVENTION

Figure 1:
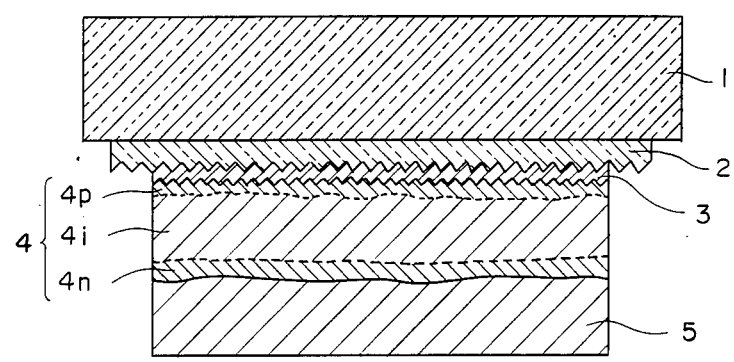
FIG. 1 is a sectional view showing a photovoltaic device according to the present invention.

Referring now to FIG. 1, which is a sectional view showing a photovoltaic device according to the present invention, a substrate 1 is formed of a transparent and insulating material such as glass, one surface of which constitutes a light incident surface of the photovoltaic device.

On the surface opposite to the light incident surface of the substrate 1, a transparent electrode layer 2 is disposed. The transparent electrode layer 2 is formed of transparent conductive oxides such as tin oxide, indium oxide, and indium-tin oxide and has a maximum thickness of about 4,000 Å. The surface opposite to the substrate 1 of the transparent electrode layer 2 is texturized in the form of a large number of triangular pyramids or quadrangular pyramids having a height of 1,000 Å to 3,000 Å and a pitch of about 1,000 Å to 3,000 Å dispersively arranged, or about 1,000 Å to 3,000·Å in average particle size.

A p-type layer 3 of oxides of the platinum group having a thickness of a few hundred angstroms is deposited on a surface of the above described transparent electrode layer 2. On a surface opposite to the substrate 1 of the layer 3 of oxides of the platinum group a semiconductive layer 4 of amorphous silicon derivative comprising at least one pin-junction, in which a p-type layer 4p, an intrinsic layer 4i, and an n-type layer 4n are arranged in this order from the side contacting layer 3 of oxides of the platinum group, is arranged. Also, on a back surface (opposite side to the substrate 1) of the semiconductive layer 4, a back electrode layer 5 in ohmic contact with the n-type layer 4n is arranged.

Such a photovoltaic device according to the present invention is produced by preparing a substrate 1, one main surface of which is deposited with the transparent electrode layer 2, by either the thermal chemical vapor deposition (CVD) method, the sputtering method, the electron beam vapor deposition method, the spary method or the like.

As an example, an almost flat transparent electrode layer 2 of tin oxide having a thickness of about 5,000 Å is formed on one main surface of the substrate 1 by sputtering in an atmosphere of oxygen and argon with tin as a target. The surface of this electrode layer 2 is then texturized by immersing it for about 20 minutes in a solution prepared by adding 10 g of zinc powder to 100 cc of 16% HCl aqueous solution. As a result, the surface of the transparent electrode layer 2 is texturized so that pyramids such as triangular pyramids and quadrangular pyramids having an undulation of about 2,000Å, a pitch of about 1,000 Å, and maximum film thickness of about 4,000 Å are formed.

Also, as discussed in Japanese Laid-open Patent Application No. 58-57756, a texturized surface may be formed directly by selecting the forming conditions of the transparent electrode layer 2.

Subsequently, on the texturized surface of the transparent electrode layer 2 a p-type layer 3 of oxides of the platinum group is deposited. The elements belonging to the platinum group include ruthenium (Ru), rhodium (Rh), palladium (Pd), osmium (Os), iridium (Ir), and platinum (Pt), corresponding to group VIII of the Periodic Table. Although these elements are usually hard to oxidize, iridium, ruthenium, and the like are oxidized by the plasma CVD method or the sputtering method in an atmosphere of oxygen using such elements as the sputtering target to form oxides of such elements.

Figure 2:
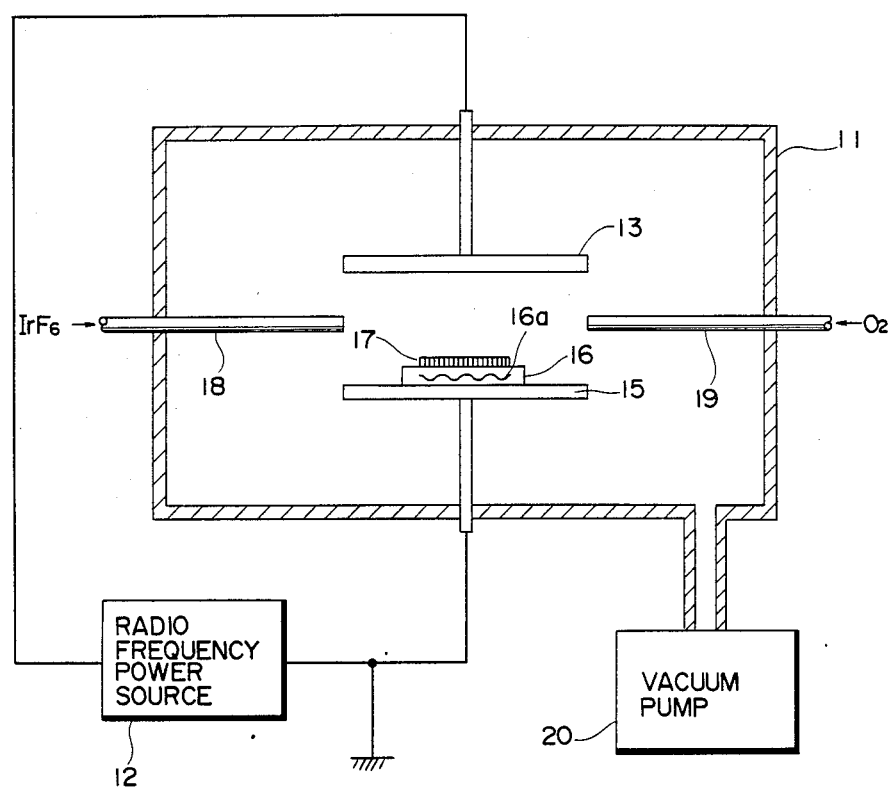
FIG. 2 is a schematic sectional view showing a reaction apparatus used for the formation of an oxide film of the platinum group.

A method for forming $IrO_x$ (iridium oxide) film by the plasma CVD method will be described below with reference to FIG. 2, which shows a schematic side sectional view of a suitable reaction apparatus used for film formation.

In this figure, numeral 11 designates a reaction chamber connected with a vacuum pump 20 so that the inside of the reaction chamber 11 can be held under vacuum. The reaction chamber 11 is provided with electrode plates 13, 15 therein in horizontally opposed relation, a radio frequency voltage being applied between both electrode plates 13, 15 from an outside radio frequency power source 12. The lower electrode plate 15 is provided with a heating table 116 enclosing a heater 16a therein on the upper surface thereof. A substrate 17 on which an oxidized film is to be formed is placed on the upper surface of the heating table 16. The heat 16a is powered by a power source (not shown).

The reaction chamber 11 is provided with a supply pipe 18 for supplying the inside of the reaction chamber 11 with $IrF_6$ gas (boiling point 53° C.) passing through an almost central portion of one side wall thereof, a front end of the supply pipe 18 extending to the side marginal portions of the electrode plates 13, 15. Also, the reaction chamber 11 is provided with a supply pipe 19 for supplying the inside of the reaction chamber 11 with $O_2$ gas similarly passing through the opposite side wall.

In order to form an $IrO_x$ film on the substrate 17 by an apparatus constructed in the above described manner, at first the vacuum pump 20 is driven to exhaust the air from the inside of the reaction chamber 11. Subsequently, $IrF_6$ gas and $O_2$ are fed into the reaction chamber 11 through the supply pipe 18 and the supply pipe 19, respectively, while maintaining a particular ratio of $IrF_6$ and $O_2$ to $IrO_x$ determined by the conditions of chemical equilibrium. At this time, the pressure within the reaction chamber 11 is always maintained at 0.1 to 10 Torr and the heater 16a is set so as to maintain the temperature of the substrate 17 at 100° to 300° C. In such an atmosphere, a voltage is applied between the electrode plates 13, 15 by the radio frequency power source 12. The electric power is set to about 0.1 to 100 W. Thus a glow discharge occurs to induce a plasma decomposition whereby $IrF_6$ and $O_2$ are decomposed to form $IrO_x$, and the resulting $IrO_x$ is deposited on the substrate 17 to form an $IrO_x$ film. In this method, the film-forming speed is 10 to 50 Å/min and the resulting $IrO_x$ film is a p-type conductive film having a transmissivity of visible rays therethrough of 80% or more and an electric resistance of $1 \times 10^3$ Ohm-cm or less.

Also, the formation of an $OsO_x$ film from $OsF_8$ and $O_2$ can be achieved in a manner similar to the above. It is similar for the other metals. Also, suitable oxides may be gasified and introduced into the reaction chamber 11 in place of oxygen.

In addition to the above described plasma decomposition using the glow discharge, the photo CVD method using photo decomposition with ultraviolet rays as an energy source, in principle, is capable of being used.

The method for forming the transparent electrode layer by sputtering is carried out in the following manner:

For example, an iridium oxide film formed at a growth rate of about 5 Å/min by sputtering in an atmosphere of oxygen having a pressure of 0.1 to 0.3 Torr at a substrate temperature of 15° C. and a radio frequency power of 0.1 W/cm$^2$ with iridium oxide exhibits p-type semiconductive properties in spite of its not containing a p-type impurity dopant. That is, it has an optical band gap of about 4 eV, a photoconductivity at room temperature of 1 Ohm$^{-1}$cm$^{-1}$ or more, and an activation energy of 0.03 eV or less. Since the optical band gap is large, about 4 eV, as described above, a film having a thickness of a few hundred angstroms does not substantially absorb visible rays.

On the other hand, an amorphous silicon derivative semiconductive layer 4 contacting the p-type layer 3 of platinum group oxide such as iridium oxide is formed by the well known plasma CVD method and photo CVD method in an atmosphere of silicon compounds. The p-type layer 4p is a hydrogenated amorphous silicon carbide film having a thickness of a few hundred angstroms formed in an atmosphere comprising silane ($SiH_4$) and methane ($CH_4$), respectively containing silicon and carbon which are film-constituent atoms, and dirorane ($B_2H_6$) as a source of p-type boron impurities. The intrinsic layer 4i and the n-type layer 4n of hydrogenated amorphous silicon are 4,000 to 6,000 Å thick and about 300 Å to 500 Å thick, respectively. The hydrogenated amorphous silicon layer is one in which hydrogen is used as a terminator of dangling bonds. There also is known another one in which hydrogen and fluorine are used as the terminator instead of hydrogen only. In addition, the above n-type layer 4n may contain microcrystalline silicon therein.

Finally, aluminum is deposited on the back side of the semiconductive layer 4 at a thickness of 1 um to form the back electrode layer 5.

Figure 3:
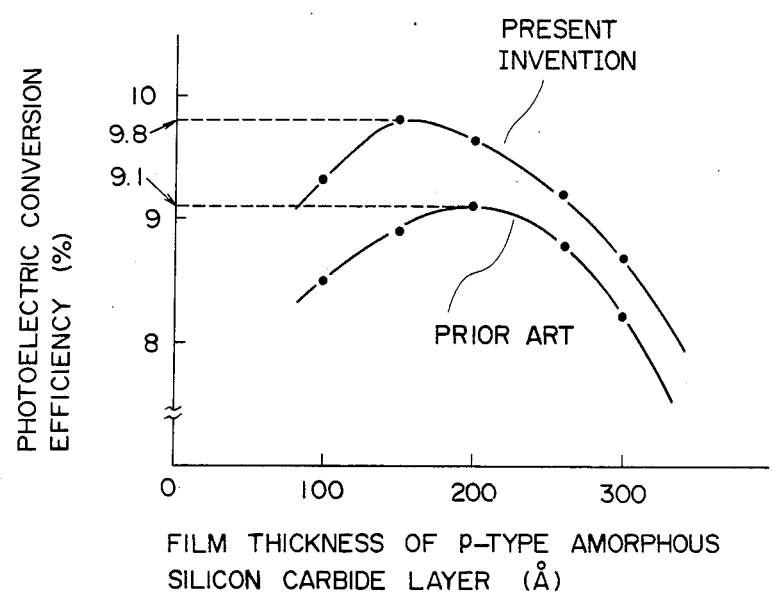
FIG. 3 is a graph showing the relationship between photoelectric conversion efficiency and thickness of the p-type layer of a semiconductive layer in a photovoltaic device according to the present invention, as compared with the conventional device.

FIG. 3 shows the photoelectric conversion efficiency of an embodiment of a photovoltaic device of the present invention produced by the above described method as compared with that of conventional devices in which the p-type amorphous silicon carbide layer 4p of the semiconductive layer 4 is deposited directly on the texturized surface of the transparent electrode layer 2 without interposing the p-type layer 3 of oxides of the platinum group on the texturized surface of the transparent electrode layer 2. The measurements of the embodiment of the present invention as well as the conventional example were carried out under the condition that the thickness of the p-type amorphous silicon carbide layer 4p of the semiconductive layer 4 is variable.

A photovoltaic device of the present invention has basically the same construction as that of the conventional one except that a p-type layer 3 of iridium oxide having a thickness of about 200 Å is interposed.

As can be seen from FIG. 3, the peak value of photoelectric conversion efficiency of a photovoltaic device of the present invention measured by a solar simulator under irradiation conditions of AM (air mass)—1, 100 mW/$cm^2$ was increased to 9.8% while that of the conventional one was 9.1%. The thickness of the p-type amorphous silicon carbide layer at the peak photoelectric conversion efficiency was different for the device of the invention and the conventional device. Also, the manufacturing yield of the photovoltaic device of the present invention was remarkably increased to 90% or more while that of the conventional one was about 20%.

The present inventors believe that such an increase of photoelectric conversion efficiency is due to an increase of electric field intensity in the pin semiconductor junction resulting from the arrangement of the p-type layer 3 of oxides of the platinum group on the light incident side of the same p-type semiconductive layer 4 and an improvement of film quality resulting from the prevention of mutual diffusion of constituent elements being the transparent electrode layer 2 and the semiconductive layer 4.

On the other hand, in the case where the thickness of the p-type silicon carbide layer 4p was fixed at 150 Å, and the thickness of the p-type layer 3 of oxides of the platinum group was varied from its fixed value of 200 Å, the photoelectric conversion efficiency was 9.1% or more in a range of film thickness of about 50 Å or more. Accordingly, a thickness of the p-type layer 3 of oxides of the platinum group of about 50 Å or more is sufficient with respect to photoelectric conversion efficiency. Also, a thickness of about 100 Å or more is preferable for the remarkable improvement of the manufacturing yield due to a poor semiconductor junction, such as occurs when the texturized surface of the transparent electrode layer 2 penetrates both p-type layers 3, 4p to directly contact the intrinsic layer 4i, and the like. In addition, since the p-type layer 3 of oxides of the platinum group contains expensive precious metals, it thickness cannot be excessively increased. Therefore, a thickness of 1,000 Å or less, preferably 500 Å or less, is better. Accordingly, the preferable thickness of the p-type layer 3 of oxides of the platinum group is about 50 to 1,000Å and about 100 Å to 500 Å is optimum.

As is obvious from the above description, in a photovoltaic device of the present invention at a first p-type layer 3 of oxides of the platinum group is deposited on the texturized surface of a transparent electrode layer 2 and then a p-type electrically conductive amorphous silicon semiconductive layer 4 is deposited on the p-type layer 3 of oxides of the platinum group whereby the p-type layer 3 of oxides of the platinum group acts to compensate for imperfections in the semiconductor junction, so that poor semiconductor junctions can be avoided, and therefore, the manufacturing yield can be increased. Also, the electric field intensity in the pin-semiconductor junction can be increased and the film can be improved in quality while the photoelectric conversion efficiency can be improved.

As this invention may be embodied in several forms without departing from the spirit and essential characteristics thereof, the present embodiment is therefore illustrative and not restrictive. The scope of the invention is defined by the appended claims rather than by the description preceding them, and all changes that fall within the metes and bounds of the claims, or the equivalent of such metes and bounds are therefore intended to be embraced by the claims.

What is claimed is:
1. A photovoltaic device comprising:
    (a) a light incident member;
    (b) a transparent electrode layer disposed on said light incident member, said transparent electrode layer having a light incident surface adjacent said light incident member and having a texturized back surface side opposite to said light incident surface;
    (c) a p-type layer of oxides of the platinum group deposited on said texturized surface of said transparent electrode layer;
    (d) a semi-conductive layer having a semi-conductor junction in which a p-type layer is disposed, said p-type semi-conductive layer disposed on and contacting said p-type layer of oxides of the platinum group; and
    (e) a back electrode layer disposed on a back surface side on said semi-conductive layer.
2. A photovoltaic device as set forth in claim 1, wherein said semiconductor junction of said semiconductive layer is a pin-junction.

3. A photovoltaic device as set forth in claim 2, wherein said p-type of said semiconductive layer layer contacting said p-type layer of oxides of the platinum group is formed of amorphous silicon carbide.

4. A photovoltaic device as set forth in claim 3, wherein said amorphous silicon carbide is hydrogenated.

5. A photovoltaic device as set forth in claim 1, wherein said p-type layer of said semiconductive layer contacting said p-type layer of oxides of the platinum group is formed of amorphous silicon carbide.

6. A photovoltaic device as set forth in claim 5, wherein said amorphous silicon carbide is hydrogenated.

7. A photovoltaic device as set forth in claim 1, wherein said layer of oxides of the platinum group is formed of any one of iridium oxide, ruthenium oxide, and osmium oxide.

8. A photovoltaic device as set forth in claim 1, wherein the thickness of said layer of oxides of the platinum group is 50 to 1,000 Å.

9. A photovoltaic device is as set forth in claim 1, wherein the thickness of said layer of oxides of the platinum group is 100 to 500 Å.

10. A photovoltaic device as set forth in claim 1, wherein said transparent electrode layer is formed of $SnO_2$.

11. A photovoltaic device as set forth in claim 1, said layer of oxides of the platinum group is formed by decomposing a raw material gas containing compounds of metals of the platinum group and oxygen and/or oxygen compounds.

12. A photovoltaic device as set forth in claim 11, wherein said compounds of metals of the platinum group are gaseous compounds of metals of the platinum group and flourine.

13. A photovoltaic device as set forth in claim 12, wherein said gas is decomposed by a plasma decomposition method using glow discharge.

14. A photovoltaic device as set forth in claim 11, wherein said gas is decomposed by a plasma decomposition method using glow discharge.

15. A photovoltaic device as set forth in claim 1, wherein said layer of oxides of the platinum group is formed by sputtering in an atmosphere of $O_2$ with metals of the platinum group as a target.

16. A photovoltaic device comprising:
(a) a light incident member;
(b) a transparent electrode layer disposed on said light incident member, said transparent electrode layer having a light incident surface adjacent said light incident member and having a texturized back surface side opposite to said light incident surface;
(c) a p-type layer of oxides of the platinum group having a face side and a back side and deposited on said texturized surface with said face side of said p-type oxide layer in contact with said transparent electrode layer;
(d) a semi-conductive layer with a face side and a back side, and having a semiconductor junction in which a p-type layer is disposed, said p-type semiconductive layer disposed on and contacting siad back side of said p-type layer of oxides of the platinum group; and
(e) a back electrode layer disposed on said back side of said semi-conductive layer.

17. A device as in claim 15, wherein said layer of p-type platinum group oxide is Ir $O_x$ having an electrical conductivity of 1 $Ohm^{-1} cm^{-1}$ or more and an activation energy of 0.03 eV or less.

18. A photovoltaic device comprising:
(a) a light incident member;
(b) a transparent electrode layer disposed on said light incident member, said transparent electrode layer having a light incident surface adjacent said light incident member and having a texturized back surface side opposite to said light incident surface;
(c) a p-type layer of oxides of the platinum group having a face side and a back side and deposited on said texturized surface with said face side of said p-type oxide layer in contact with said transparent electrode layer;
(d) a semi-conductive layer with a face side and a back side, and having a semiconductor junction in which a p-type layer is disposed, said p-type semiconductive layer disposed on and contacting said back side of said p-type layer of oxides of the platinum group, said semi-conductive layer comprising amorphous silicon carbide; and
(e) a back electrode layer disposed on said back side of said semi-conductive layer.

* * * * *